(12) United States Patent
Cong et al.

(10) Patent No.: US 8,293,545 B2
(45) Date of Patent: Oct. 23, 2012

(54) CRITICAL DIMENSION FOR TRENCH AND VIAS

(75) Inventors: Hai Cong, Singapore (SG); Yan Shan Li, Toronto (CA); Chun Hui Low, Singapore (SG); Yelehanka Ramachandramurthy Pradeep, Singapore (SG); Liang Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 123 days.

(21) Appl. No.: 11/927,658

(22) Filed: Oct. 29, 2007

(65) Prior Publication Data

US 2009/0108257 A1 Apr. 30, 2009

(51) Int. Cl.
*G01R 31/26* (2006.01)
*H01L 21/66* (2006.01)
*H01L 23/58* (2006.01)
*H01L 29/10* (2006.01)

(52) U.S. Cl. .......... 438/14; 438/381; 438/489; 438/800; 257/48; 257/409; 257/499

(58) Field of Classification Search .................. None
See application file for complete search history.

(56) References Cited

U.S. PATENT DOCUMENTS

| | | | | |
|---|---|---|---|---|
| 5,790,254 A | * | 8/1998 | Ausschnitt | 356/603 |
| 6,084,287 A | * | 7/2000 | Mitwalsky et al. | 257/620 |
| 6,395,438 B1 | * | 5/2002 | Bruce et al. | 430/30 |

OTHER PUBLICATIONS

Cong et al., Wafer level microarcing model in 90 nm chemical-vapor deposition low-k via etch on 300 mm silicon-on-insulator substrate, © 2006 American Vacuum Society, J. Vac. Sci. Technol. A 24 (4), Jul./Aug. 2006.*

* cited by examiner

*Primary Examiner* — Evan Pert
*Assistant Examiner* — Andres Munoz
(74) *Attorney, Agent, or Firm* — Horizon IP Pte Ltd

(57) ABSTRACT

Test structures including test trenches are used to define critical dimension of trenches in a via level of an integrated circuit to produce substantially the same depth. The trenches are formed at the periphery of the IC to serve as guard rings.

22 Claims, 11 Drawing Sheets

CRITICAL DIMENSION FOR TRENCH AND VIAS

FIELD OF THE INVENTION

The present invention relates generally to semiconductor devices, and more particularly to mitigating micro-loading effects on holes and trenches in integrated circuits (ICs).

BACKGROUND OF THE INVENTION

Metal guard rings are commonly provided around the peripheral of a die. The guard rings serves as, for example, moisture barriers, crack stops or grounds. Different guard rings can be provided for different purposes. FIG. 1 shows a die 100 with guard rings 120 and 140 formed at the periphery of a die 100. For example, the outer guard ring serves as a crack stop while the inner guard ring serves as a moisture barrier. As shown, the outer guard ring is rectangular in shape while the inner guard ring has 45° angles 145 at the corner of the die, forming an octagon-shaped guard ring. Typically, each guard ring can include a plurality of rings or sub-rings. For example, a guard ring may have 5 sub-rings.

The guard rings are formed in the via levels of the die. For example, as shown in FIG. 2a, trenches 228 are etched in the interlevel dielectric layer 209 on a substrate 201 at the periphery of the die along with vias 260. The critical dimension CD for guard rings is the same as that for vias. Due to micro-loading effects, trench etch rate is faster than via etch rate. The difference in etch rates is even more prominent for low-K dielectric materials. This results in the trench punching through the barrier 265 below the interlevel dielectric. FIG. 2b shows a SEM evidencing the difference in etch rate between vias 260 and trenches 228. The trench etch rate is about 10-20% faster than the via etch, resulting in trench depth of about 1.8 Å deeper than the vias. Punching through the barrier layer may undesirably result in L-arcing which leads to etch defects such as particle and ball defects, negatively impacting yield.

From the foregoing, it is desirable to prevent the effects of micro-loading within ICs and improve reliability during production of ICs so as to improve yield when improvising guard rings within the IC design.

SUMMARY OF THE INVENTION

The present invention relates to ICs. More particularly, the invention relates to mitigating micro-loading effects on holes and trenches in ICs.

A test structure used to characterize trenches with respect to vias is provided. In one embodiment, the test structure comprises a plurality of geometrically shaped concentric trenches which are separated by spaces and is employed for the purposes of defining critical dimension of guard rings. The concentric trenches may be shaped in various dimensions such as length and/or intersection angles in accordance to desired guard ring purpose.

In another embodiment, the invention relates to a method of forming an IC. The method comprises defining trench critical dimension ($T_{CD}$) of trenches in a via level of the IC with test structures, wherein $T_{CD}$ produces trenches and vias with substantially the same depth. A dielectric layer on a partially processed substrate, wherein the dielectric layer serves as a via level of the IC. Trenches are formed in a periphery of the substrate having $T_{CD}$ and vias in the via level followed by filling of the trenches and vias with a conductive material. Processing of the substrate is continued to complete forming the IC.

In another embodiment, an integrated circuit (IC) having one or more trenches in which the trench critical dimension has been defined by trench and via test structures wherein the trench and via produced have substantially matching depths. Preferably, the depths of the via and the trench are the same. A conductive material, provided within the trenches, serves as a guard ring.

In one aspect of the invention, a method of forming an IC is provided. The method comprises providing a test wafer having test structures, using the test wafer to define trench CD such that trenches and vias with substantially the same depth can be defined. The defined trench CD are then used to form the IC.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

Figure 1:
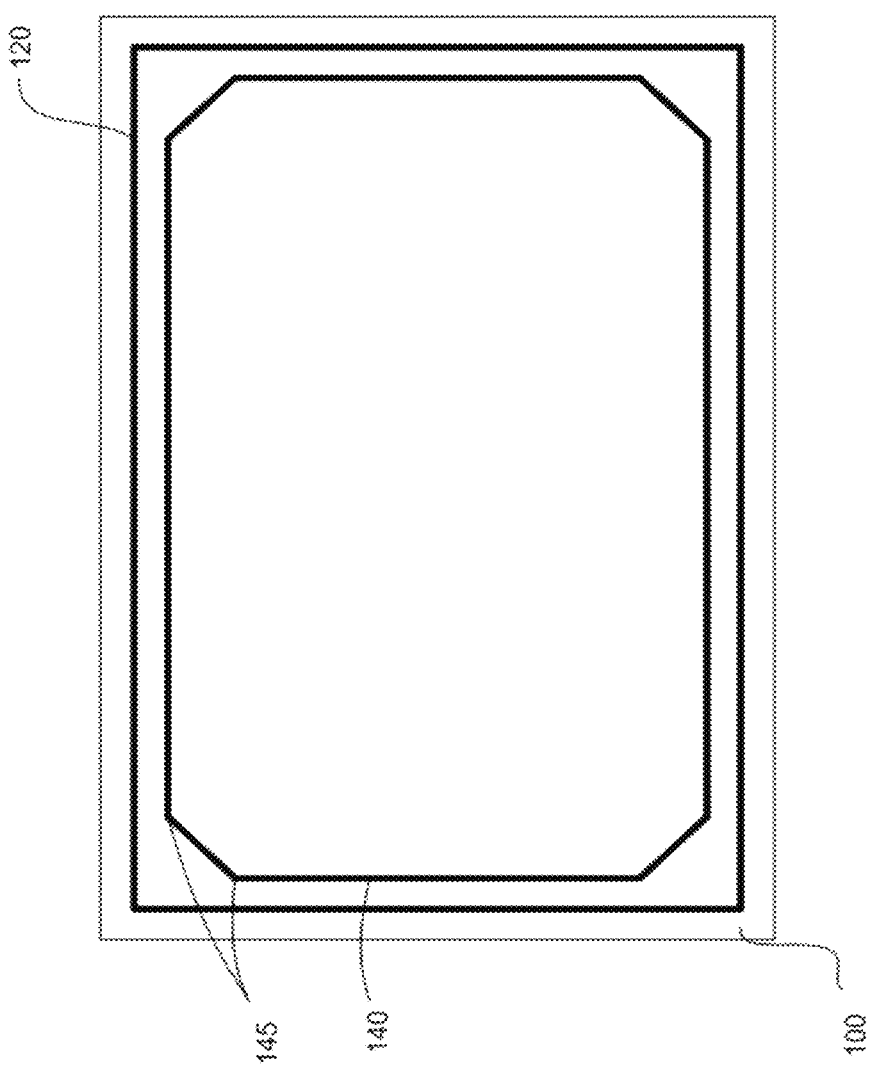
FIG. 1 shows a die with guard rings.
Figure 2A:
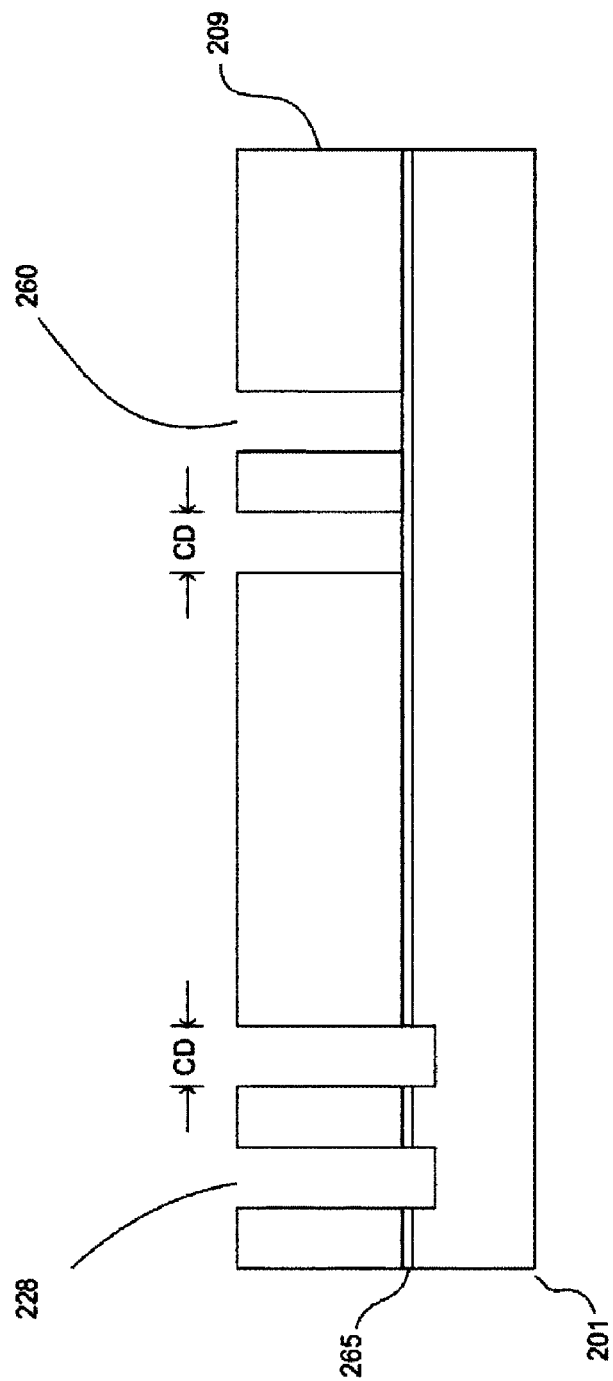
FIGS. 2a-b show micro-loading effects of etching trenches and vias.
Figure 2B:
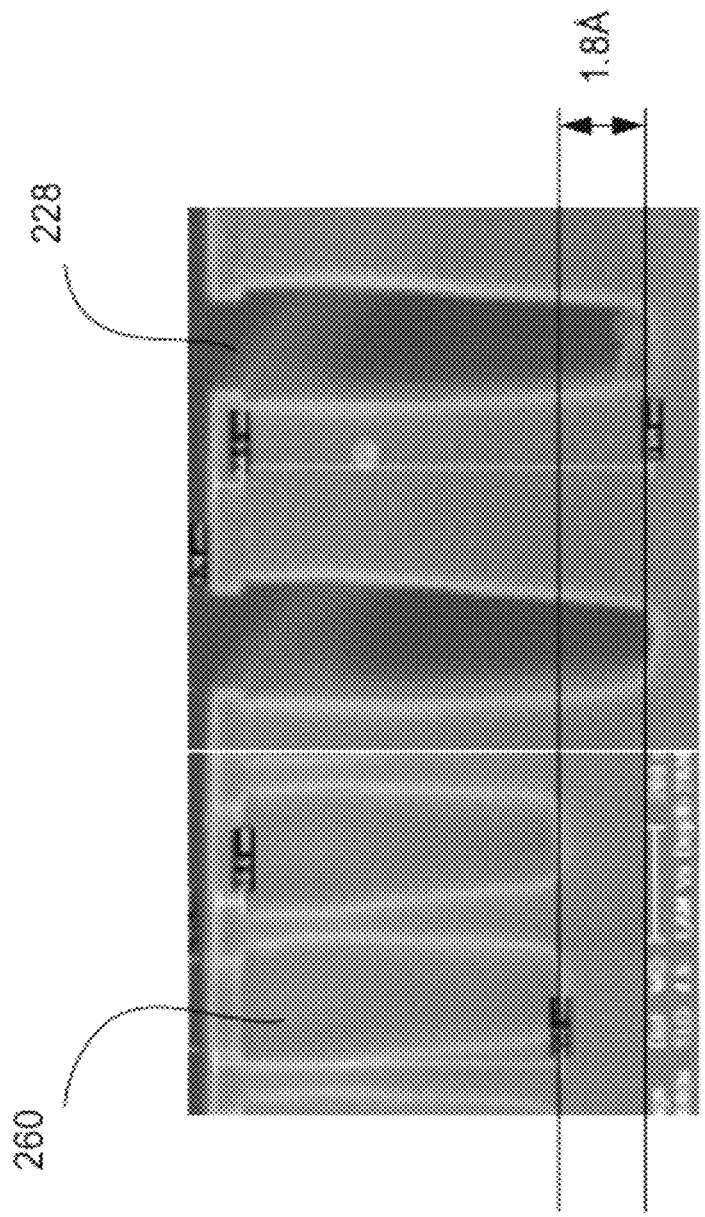
Figure 3:
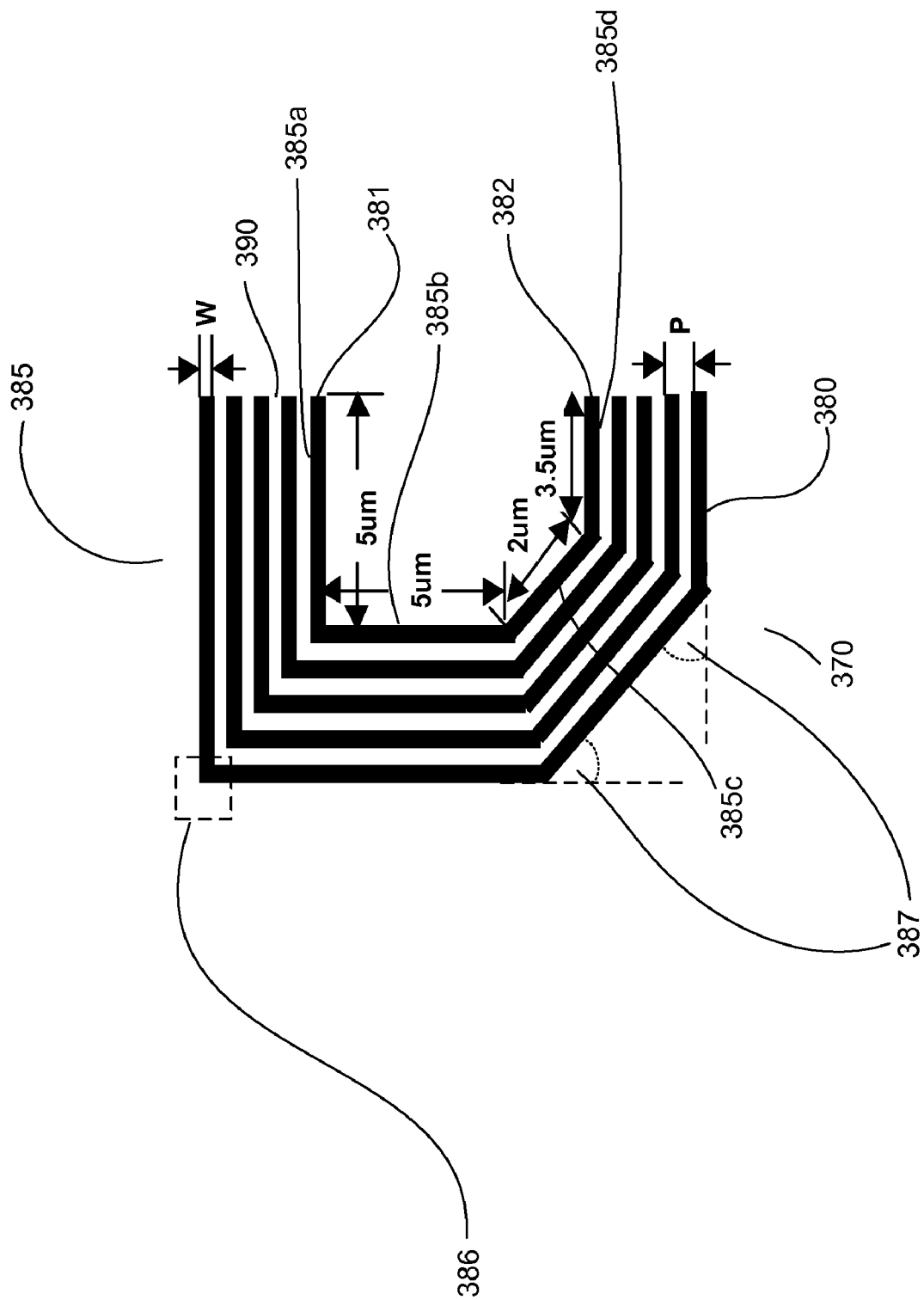
FIG. 3 shows a trench test structure in accordance with one embodiment of the invention.

The present invention relates to a test pattern or structure. The test pattern, in one embodiment, is used to characterize trenches with respect to vias. For example, the trenches serve as guard rings on via levels of an IC. The test pattern can also be used to characterize features in which microloading causes process issues. FIG. 3 shows a trench test pattern 370 in accordance with one embodiment. The trench test structure comprises a plurality of trenches 380. The number of trenches should be sufficient to check etch depth. In one embodiment, the trench test structure comprises five trenches. Other number of trenches is also useful. As shown, the trenches comprise geometric patterns. The pattern comprises open-ended concentric trenches having first and second ends 381 and 382. Providing closed ended concentric trenches are also useful. The trenches are separated by spaces 390.

The geometric shape of the trench test pattern should include elements that are in the guard rings for characterization. For example, if guard rings have straight portions, right angled portions and 45° portions, the test pattern should also contain straight portions 385, right angled portions 386 and 45° portions 387. Other elements can also be included in the trench test structure. The additional elements can reflect elements used in the guard rings or for consideration to optimize trench or guard ring design. The inner trench comprises, for example, a first straight portion 385a of 5 um in length, a second straight portion 385b of 5 um which is 90° with respect to the first straight portion, a third straight portion 385c of 2 um which is 45° with respect to the second straight portion and a fourth straight portion 385d of 3.5 um which is 45° with respect to the third straight portion. Other dimensions are also useful. The trench test pattern comprises trench width W with a pitch P.

One or more trench test structures are provided. Typically the test structures are provided on a test wafer. Providing test structures on production wafers are also useful, for example, at kerf areas. The trench test structures, for example, are formed on a dielectric material. Preferably, the test structures are formed on the same dielectric material as that used in the IC. For example, the dielectric material comprises low-k dielectric material. Other types of dielectric materials are also useful.

Figure 4A:
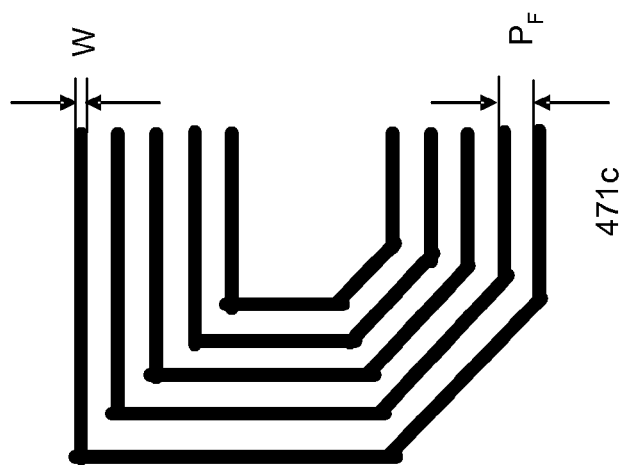
FIG. 4 shows trench test structures in accordance with one embodiment of the invention.
Figure 4A:
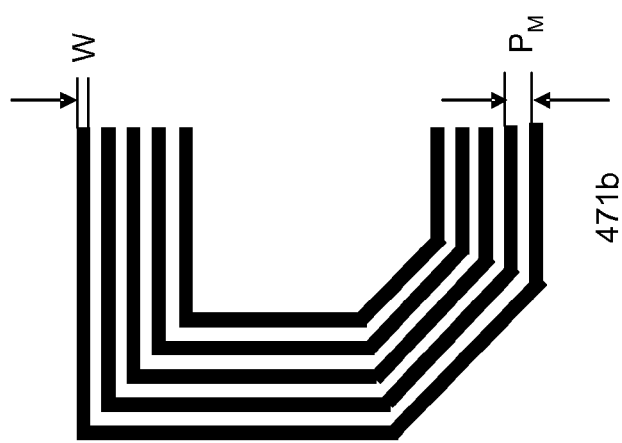
Figure 4A:
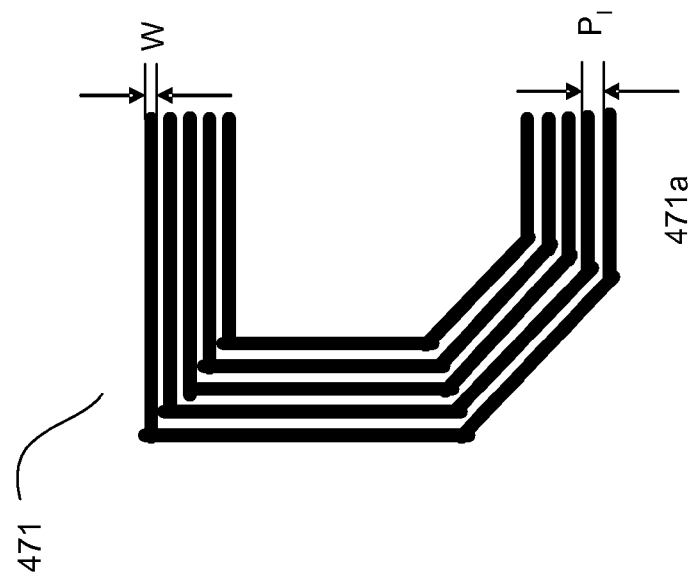
Figure 4B:
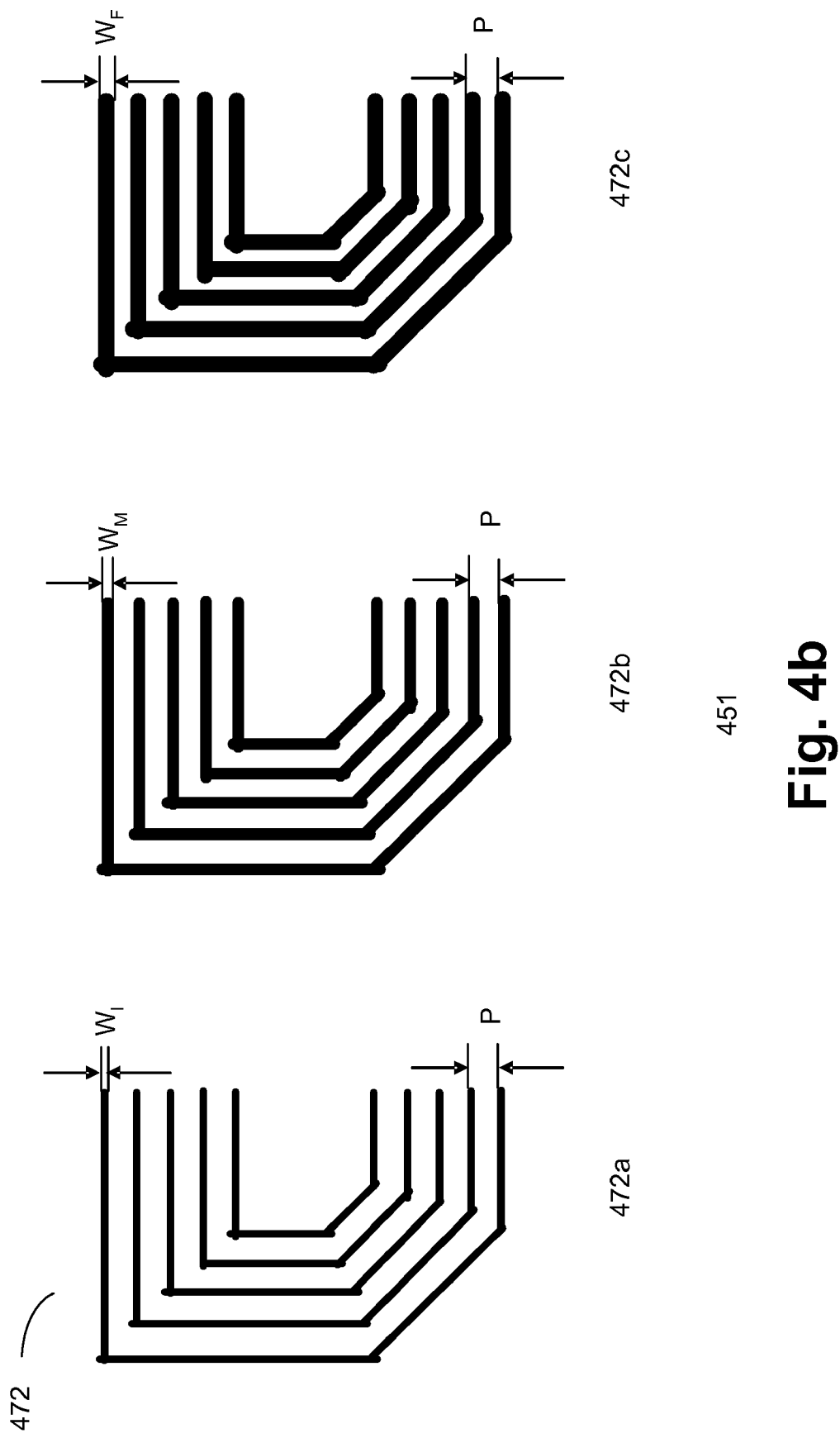

FIGS. 4a-b show trench test structures in accordance with embodiments of the invention. Referring to FIG. 4a, a test structure set 450 is shown. The set comprises a plurality of trench test structures 471. The set comprises, for example, three trench test structures 471a-c. Providing sets having other number of test structures is also useful. The trench test structures of the set have the same or a similar geometric shape. In one embodiment, the trench width W of the test structures are the same while the pitch are varied between an initial pitch value $P_I$ to a final pitch value $P_F$. Intermediate test structures $P_M$ have a pitch value between $P_I$ and $P_F$. In one embodiment, the pitch of the intermediate test structures is varied equally. For example, the variance is determined by $P_F - P_I/n$, where n is equal to the number of intermediate trench test structures. $P_I$, for example, is equal to 140 nm and $P_F$ is equal to 1040 nm, with the intermediate test structure having $P_M$ of 590 nm. Providing test structures with other pitch range is also useful, depending on the technology of interest. For example, test structures with a pitch range from 140-1040 nm are useful for 45 to 130 nm. Other configurations of pitch variances are also useful. For example, the pitch of the trench test structures can be varied unequally.

Referring to FIG. 4b, a trench test structure set 451 is shown. The set comprises a plurality of trench test structures 472. As shown, three test structures 472a-c are provided. Sets having other number of test structures are also useful. The trench test structures of the set have the same or a similar geometric shape. In one embodiment, the trench width W of the trench test structures are varied between an initial width value $W_I$ to a final pitch value $W_F$ while the pitch is the same. Intermediate trench test structures have a width $W_M$ value between $W_I$ and $W_F$. In one embodiment, the width of the intermediate test structures is varied equally. For example, the variance is determined by $W_F - W_I/n$, where n is equal to the number of intermediate trench test structures. $W_I$, for example is equal to 40 nm and $W_F$ is equal to 400 nm, with the intermediate test structure having $W_M$ of 220 nm. Test structures with other width variances are also useful, depending on the technology of interest. For example, test structures with width range from 40-400 nm are useful for 45 to 130 nm. Other configurations of width variances are also useful. For example, the width of the trench test structures can be varied unequally.

In one embodiment, first and second sets of trench test structures 450-451, as shown in FIGS. 4a-b, are provided at test structure sites. Providing other trench test structures or trench test structure sets is also useful. For example, a trench test structure can include trenches with varying widths and pitches. Such test structures can be included into a trench test structure set having a plurality of test structures. The other trench test structure sets can be, for example, used in combination with first and second test structure sets. Other configurations of trench test structures or trench test structure sets are also useful.

Figure 5A:
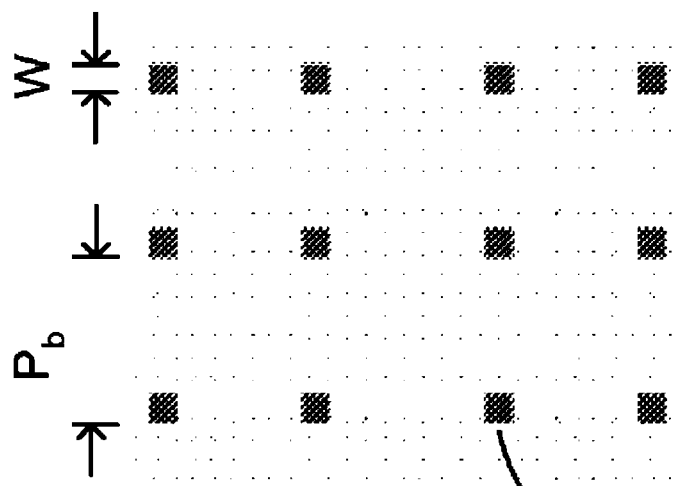
FIGS. 5a-b show via test structures in accordance with various embodiments of the invention.
Figure 5A:
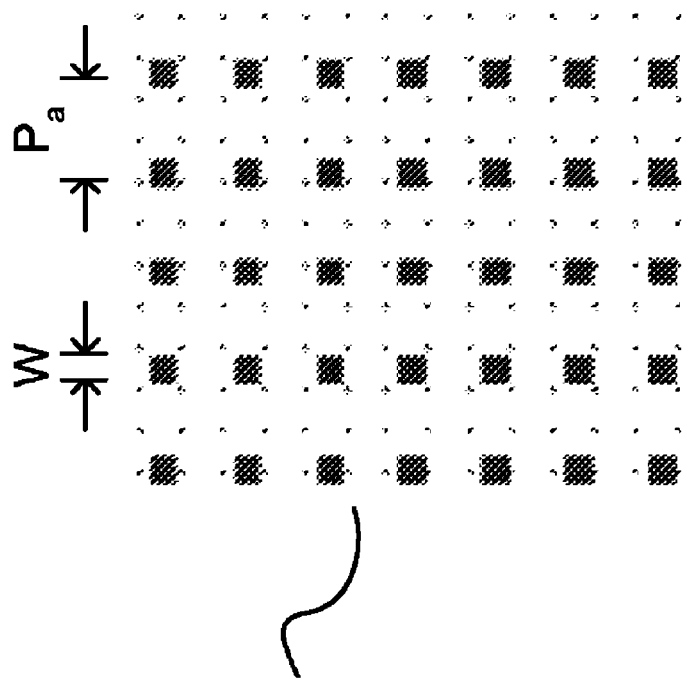

The test wafer also includes via test sites. FIG. 5a shows via test structures disposed in via test sites in accordance with one embodiment of the invention. The via test structures are formed on the same device layer as the trench test structures. In one embodiment, first and second test via structures 573a-b are provided in first and second via test sites. Test via structures include a plurality of contact vias or holes 587 of the same size or width W. The width W corresponds to contact via CD. In one embodiment, first via test structure have contact holes with a first pitch $P_a$ and the second via test structure have contact holes with a second pitch $P_b$. The first pitch, for example, corresponds to dense contact holes while the second pitch corresponds to isolated contact holes. Providing additional via test structures having other pitches is also useful.

As described, the contact holes of a via test structure have fixed width and fixed pitch. Providing test structures in which contact holes have width variances is also useful. For example, contact holes with nominal and sub-nominal widths can be included in the test structure. Sub-nominal width contact holes in the test structure are useful, for example, to verify process window. Other size contact holes can also be included in the test structure.

Figure 5B:
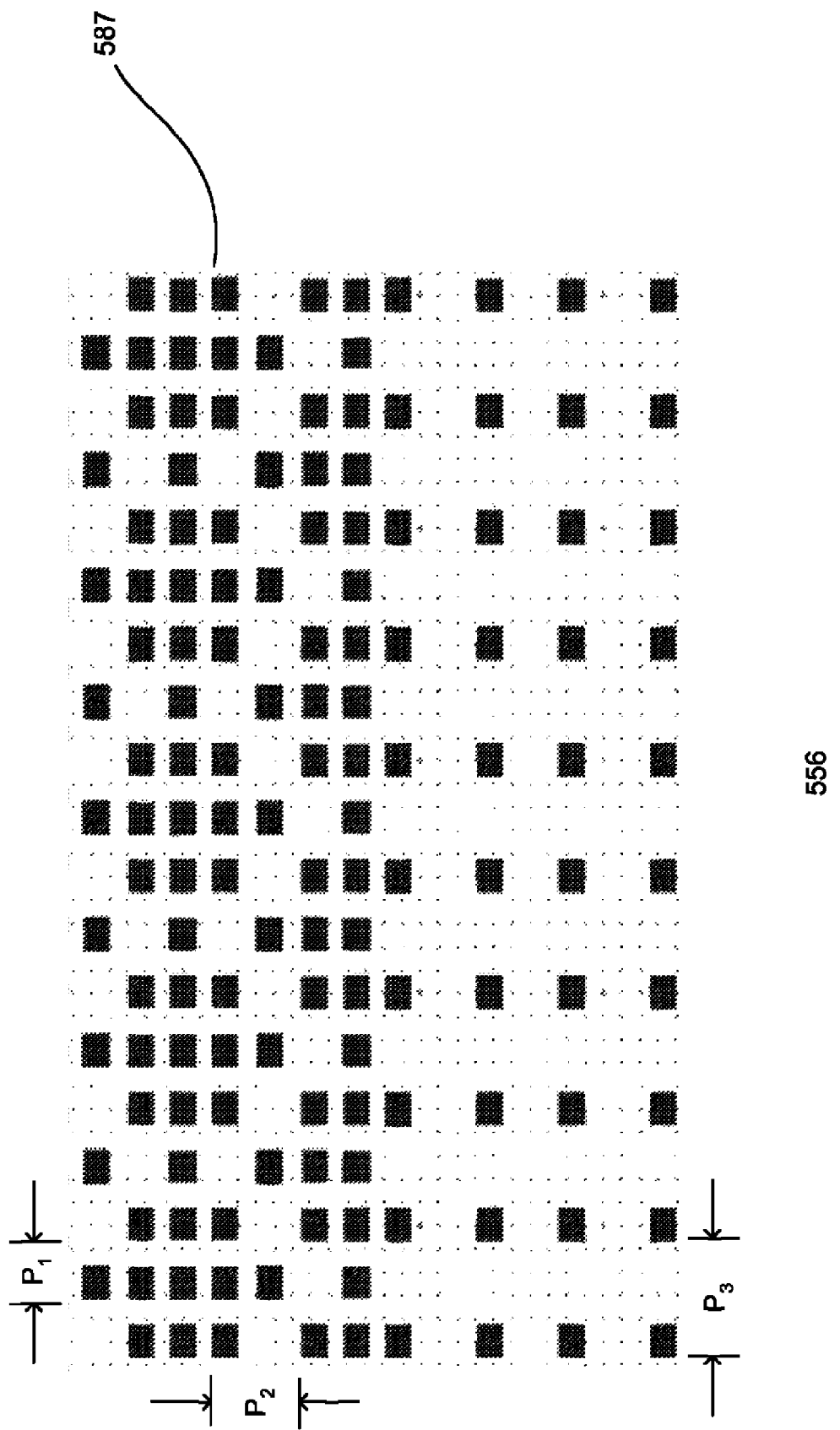

FIG. 5b shows a via test structure in accordance with another embodiment of the invention. The via test structure comprises a plurality of contact vias with varying pitches. In one embodiment, the via test structure comprises at least two different pitches. Preferably, the via test structure comprises at least three different pitches $P_{1-3}$. Contact holes with different widths can be included in the test structure. The via test sites of the test wafer can be provided with different via test structures. For example, the test sites can be provided with vias having fixed width/fixed pitch test structures, varying width/fixed pitch test structures, fixed width/varying pitch test structures, varying width/varying pitch or a combination thereof.

Figure 6A:
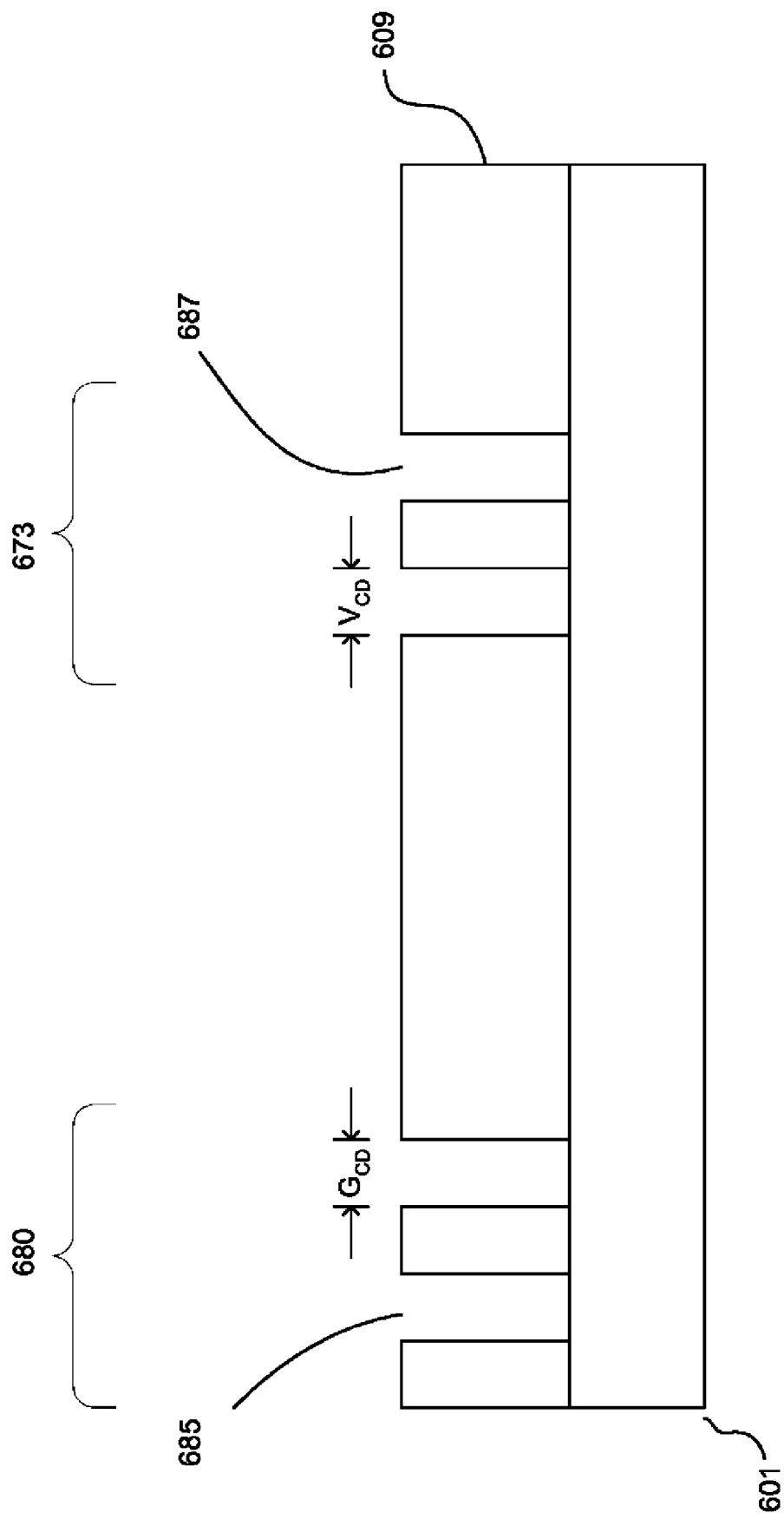
FIGS. 6a-b show a cross-sectional view of processed wafers with test structures in accordance with embodiments of the invention.
Figure 6B:
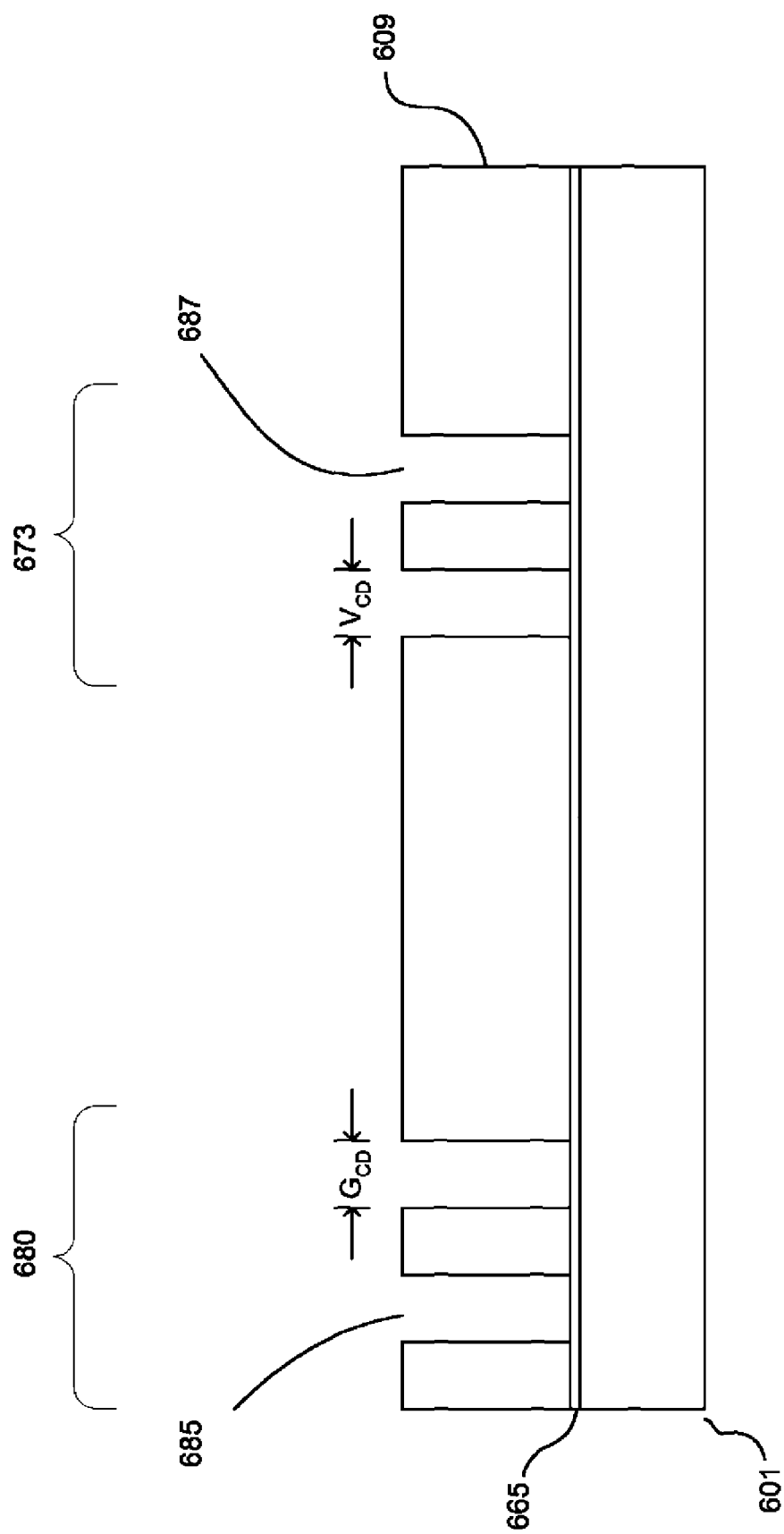

FIG. 6a shows a portion of a processed test wafer with trench and via test structures 680 and 673. As shown, the test wafer includes a dielectric layer 609 formed on the substrate 601. The thickness of the layers is about the same as that used in forming vias in the IC to be formed. The test wafer is patterned to form trench structure 680 and via structure 673. Patterning of the test wafer is achieved using an anisotropic etch, such as reactive ion etching (RIE). By having different via and trench test structures, the trench CD $G_{CD}$ and via CD $V_{CD}$ can be determined to produce trenches 685 and vias 687 having the same or substantially the same depth (e.g., $d_1 \approx d_2$). For example, the difference between $d_1$ and $d_2$ is 5% or less. Preferably, the difference between $d_1$ and $d_2$ is less than 5%. Providing $d_1$ and $d_2$ which are within other percentages of each other is also useful. Alternatively, a plurality of test wafers are processed, employing different etch parameters such as CD bias and etch depth u-loading. The test wafers are analyzed to determine the desired $G_{CD}$ and process parameters for fabricating the IC. Once the desired $G_{CD}$ is determined, it is verified on a test wafer which includes etch stop and dielectric layers 665 and 609 formed on the test wafer substrate 601, as shown in FIG. 6*b*.

Figure 7:
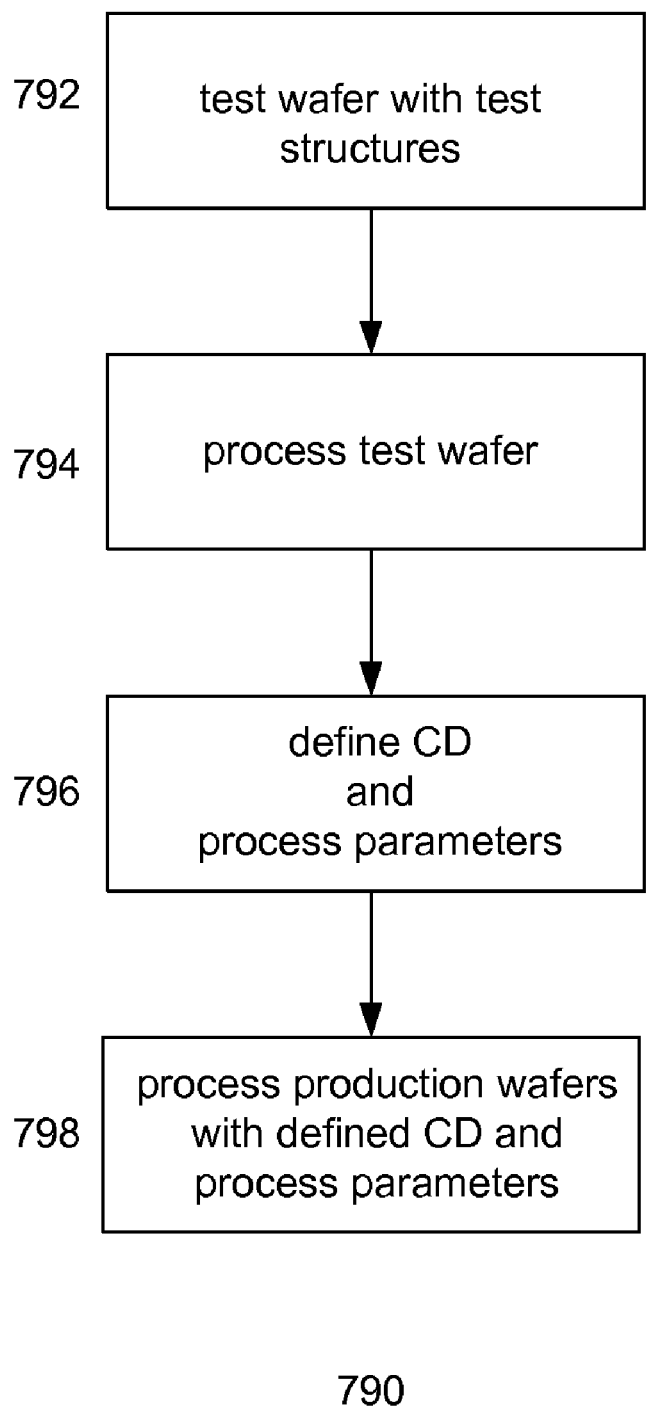
FIG. 7 shows a process for forming an IC in accordance with one embodiment of the invention.

FIG. 7 shows a process 790 for forming an IC in accordance with one embodiment of the invention. The process commences by preparing a test wafer at step 792. The test wafer includes an etch stop and dielectric layers formed thereon. Antireflective and photoresist layers are formed over the dielectric layer. Materials and thicknesses of the various layers are, for example, the same as those used in forming the IC. For example, the etch stop layer comprises SiN/SiC and the dielectric layer comprises FTEOS/Low-K material. Providing other types etch stop and dielectric layers are is useful.

At step 794, the test wafer is processed. In one embodiment, the resist layer is exposed with an exposure source with a pattern corresponding to trench and via test structures in accordance with various embodiments of the invention. The resist is then developed, removing exposed or unexposed portions, depending on whether a positive or negative resist is used. The developed resist contains the pattern of the trench and via test structures.

The dielectric layer is then patterned to form trench and via test structures. In one embodiment, the dielectric layer is patterned using an anisotropic etch, such as RIE. After patterning, the test structures are analyzed to determine the appropriate $G_{CD}$ and $V_{CD}$ for the IC. Preferably, the optimal $G_{CD}$ and $V_{CD}$ is determined form the analysis of the processed test wafer.

In another embodiment, a plurality of test wafers are processed with the same test patterns but using different etch process parameters. The processed test wafers are then analyzed to determine the appropriate $G_{CD}$, $V_{CD}$ and process parameter for the IC at step 796. Preferably, the optimal $G_{CD}$, $V_{CD}$ and process parameters are determined by the analysis of the processed test wafer. The $G_{CD}$ and $V_{CD}$ determined by the analysis are incorporated into the design of the IC at step 798. In another embodiment, $G_{CD}$, $V_{CD}$ and process parameters determined by the analysis of the processed test wafer are incorporated into the design of the IC. Production wafers are processed to form ICs with, in one embodiment, guard rings and vias having CD defined by analysis of test structures.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming an integrated circuit (IC) comprising:
   providing a test substrate;
   etching the test substrate using a first etch process to form a plurality of test structures on the test substrate, wherein a test structure comprises trenches and spaces between the trenches, and different test structures of the plurality of test structures have different test structure dimensions;
   determining a trench critical dimension ($T_{CD}$) of trenches in a via level of the IC using the plurality of test structures on the test substrate formed by the first etch process, wherein the $T_{CD}$ is equal to a selected test structure dimension of a selected test structure from the plurality of test structures on the test substrate, wherein the selected test structure has trenches and vias having substantially the same depth from the first etch process;
   providing a partially processed substrate of the IC;
   depositing a dielectric layer on the partially processed substrate;
   forming the trenches using the $T_{CD}$ in a periphery of the substrate in the dielectric layer and vias in the dielectric layer, wherein the trenches and vias have substantially the same depth due to the $T_{CD}$;
   filling the trenches and vias with a conductive material; and
   continuing to process the substrate to complete forming the IC.

2. The method of claim 1 wherein the trenches in the via level serve as guard rings surrounding the periphery of the IC.

3. The method of claim 1 wherein the depths of vias and trenches are within 5% of each other.

4. The method of claim 1 wherein determining the $T_{CD}$ comprises forming the plurality of test structures comprising test trenches having a geometric pattern with components which are consistent with the trenches in the periphery of the substrate, wherein the plurality of test structures comprise the test trenches of varying widths and pitches.

5. The method of claim 4 wherein the geometric pattern of test trenches includes straight and angled components.

6. The method of claim 4 wherein the geometric pattern of test trenches includes straight, 45° and 90° components.

7. The method of claim 4 wherein the plurality of test structures comprise a plurality of open ended test trenches with straight and angled components.

8. The method of claim 4 wherein the plurality of test structures comprise:
   a first set of first test structures, the first test structures each comprising a plurality of first test trenches having a same width, wherein different first test structures have different pitches; and
   a second set of second test structures, the second test structures each comprising a plurality of second test trenches having a same pitch, wherein different second test structures have different widths.

9. The method of claim 8 wherein the geometric pattern of test trenches includes straight and angled components.

10. The method of claim 8 wherein the geometric pattern of test trenches includes straight, 45° and 90° components.

11. The method of claim 8 wherein the plurality of test structures comprise a plurality of open ended test trenches with straight and angled components.

12. The method of claim 1 wherein the plurality of test structures comprise:
   a first set of first test structures, the first test structures each comprising a plurality of first test trenches having a same width, wherein different first test structures have different pitches; and
   a second set of second test structures, the second test structures each comprising a plurality of second test trenches having a same pitch, wherein different second test structures have different widths.

13. The method of claim 12 wherein the geometric pattern of test trenches includes straight and angled components.

14. The method of claim 12 wherein the geometric pattern of test trenches includes straight, 45° and 90° components.

15. The method of claim 12 wherein the plurality of test structures comprise a plurality of open ended test trenches with straight and angled components.

16. A method of forming a device comprising:
   providing a test substrate;
   etching the test substrate using a first etch process to form a plurality of test structures on the test substrate, wherein a test structure comprises trenches and spaces between the trenches, and different test structures of the plurality of test structures have different test structure dimensions;

determining a trench critical dimension ($T_{CD}$) of trenches in a via level of the device using the plurality of test structures on the test substrate formed by the first etch process, wherein the $T_{CD}$ is equal to a selected test structure dimension of a selected test structure from the plurality of test structures on the test substrate, wherein the selected test structure has trenches and vias having substantially the same depth from the first etch process;

providing a dielectric layer on a substrate of the device; and forming the trenches and vias in the dielectric layer, wherein the trenches are formed using the $T_{CD}$, wherein the trenches and vias are formed with substantially the same depth due to the $T_{CD}$.

17. The method of claim 16 wherein the trenches in the dielectric layer serve as guard rings surrounding the periphery of the device.

18. The method of claim 16 wherein depths of vias and trenches are within 5% of each other.

19. The method of claim 16 wherein determining the $T_{CD}$ comprises forming the plurality of test structures comprising test trenches having a geometric pattern with components which are consistent with the trenches in the periphery of the substrate, wherein the test structures comprise the test trenches of varying widths and pitches.

20. The method of claim 19 wherein the geometric pattern of test trenches includes straight and angled components.

21. The method of claim 19 wherein the geometric pattern of test trenches includes straight, 45° and 90° components.

22. A method of forming a device comprising:

providing a test substrate;

etching the test substrate using a first etch process to form a plurality of test structures on the test substrate, wherein different test structures of the plurality of test structures have different test structure dimensions;

determining a trench critical dimension ($T_{CD}$) of trenches in a via level of the device using the plurality of test structures on the test substrate formed by the first etch process, wherein the $T_{CD}$ is equal to a selected test structure dimension of a selected test structure from the plurality of test structures on the test substrate, wherein the selected test structure has trenches and vias having substantially the same depth from the first etch process; and using the $T_{CD}$ to form trenches and vias in a via level in the device.

* * * * *